(12) United States Patent
Leib et al.

(10) Patent No.: US 7,786,002 B2
(45) Date of Patent: Aug. 31, 2010

(54) METHOD FOR PRODUCING A COMPONENT COMPRISING A CONDUCTOR STRUCTURE THAT IS SUITABLE FOR USE AT HIGH FREQUENCIES

(75) Inventors: Jürgen Leib, Freising (DE); Dietrich Mund, Obersüssbach (DE)

(73) Assignee: Schott AG, Mainz (DE)

( * ) Notice: Subject to any disclaimer, the term of this patent is extended or adjusted under 35 U.S.C. 154(b) by 501 days.

(21) Appl. No.: 10/515,035

(22) PCT Filed: May 23, 2003

(86) PCT No.: PCT/EP03/05415

§ 371 (c)(1),
(2), (4) Date: Jul. 13, 2005

(87) PCT Pub. No.: WO03/100859

PCT Pub. Date: Dec. 4, 2003

(65) Prior Publication Data

US 2006/0012005 A1    Jan. 19, 2006

(30) Foreign Application Priority Data

May 23, 2002    (DE) .............................. 102 22 609

(51) Int. Cl.
*H01L 21/4763* (2006.01)
(52) U.S. Cl. ................ 438/622; 438/612; 257/E21.275
(58) Field of Classification Search ................ 438/622, 438/612; 257/E21.275
See application file for complete search history.

(56) References Cited

U.S. PATENT DOCUMENTS

| 2,965,519 | A | * | 12/1960 | Christensen ................. 438/660 |
| 3,417,393 | A | | 12/1968 | Cooke et al. |
| 4,492,717 | A | | 1/1985 | Pliskin et al. |
| 4,564,997 | A | | 1/1986 | Matsuo et al. ................. 29/576 |
| 5,092,032 | A | * | 3/1992 | Murakami ..................... 29/830 |
| 5,597,767 | A | * | 1/1997 | Mignardi et al. .............. 438/14 |

(Continued)

FOREIGN PATENT DOCUMENTS

DE    19846691    11/1999

(Continued)

OTHER PUBLICATIONS

McNally, J. J.; "Ion Assisted Deposition" in "Handbook of Plasma Processing Technology"; 1990; Noyes Publications; pp. 466-482.*

(Continued)

*Primary Examiner*—Matthew C Landau
*Assistant Examiner*—Vicki B Booker
(74) *Attorney, Agent, or Firm*—Ohlandt, Greeley, Ruggiero & Perle, LLP

(57) ABSTRACT

The invention provides a process for producing a substrate having a conductor arrangement that is suitable for radio-frequency applications, with improved radio-frequency properties. For this purpose, the process includes the steps of: depositing a structured glass layer having at least one opening over a contact-connection region by evaporation coating on the substrate and applying at least one conductor structure to the structured glass layer so that the at least one conductor has electrical contact with the contact-connection region.

21 Claims, 12 Drawing Sheets

U.S. PATENT DOCUMENTS

| | | | |
|---|---|---|---|
| 5,710,082 A | | 1/1998 | Kawakami et al. |
| 5,929,510 A | * | 7/1999 | Geller et al. ................ 257/635 |
| 6,127,025 A | * | 10/2000 | Bhatt et al. ................. 428/209 |
| 2002/0011653 A1 | * | 1/2002 | Ferrari et al. ............... 257/678 |
| 2003/0080408 A1 | * | 5/2003 | Farnworth et al. .......... 257/698 |

FOREIGN PATENT DOCUMENTS

| | | |
|---|---|---|
| DE | 10042653 | 3/2002 |
| EP | 1168609 | 1/2002 |
| WO | 03088347 | 10/2003 |

OTHER PUBLICATIONS

Pongratz, S. and Zoller, A.; "Plasma ion-assisted deposition: A promising technique for optical coatings"; J. Vac. Sci. Technol. A 10(4); Jul./Aug. 1992; p. 1897-1904.*

"Dictionary of Engineering Materials"; 2004; John Wiley & Sons, Inc.; p. 480.*

Office Action from corresponding European Patent Application No. 03 735 449.5 dated Sep. 9, 2008.

International Preliminary Examination Report dated Aug. 9, 2004 corresponding to International Patent Application No. PCT/EP03/05415.

* cited by examiner

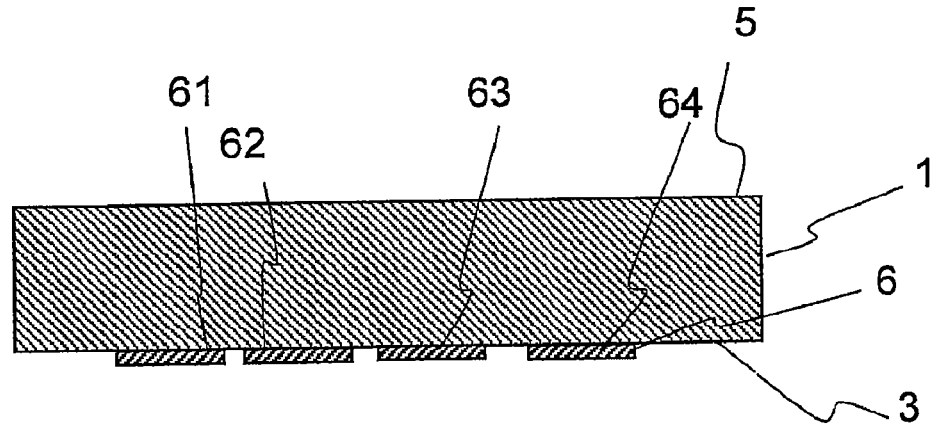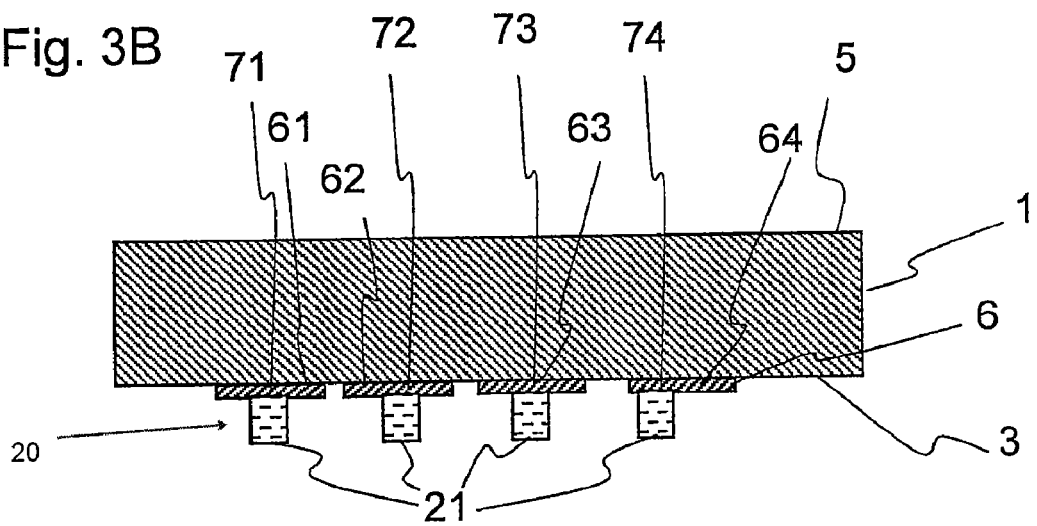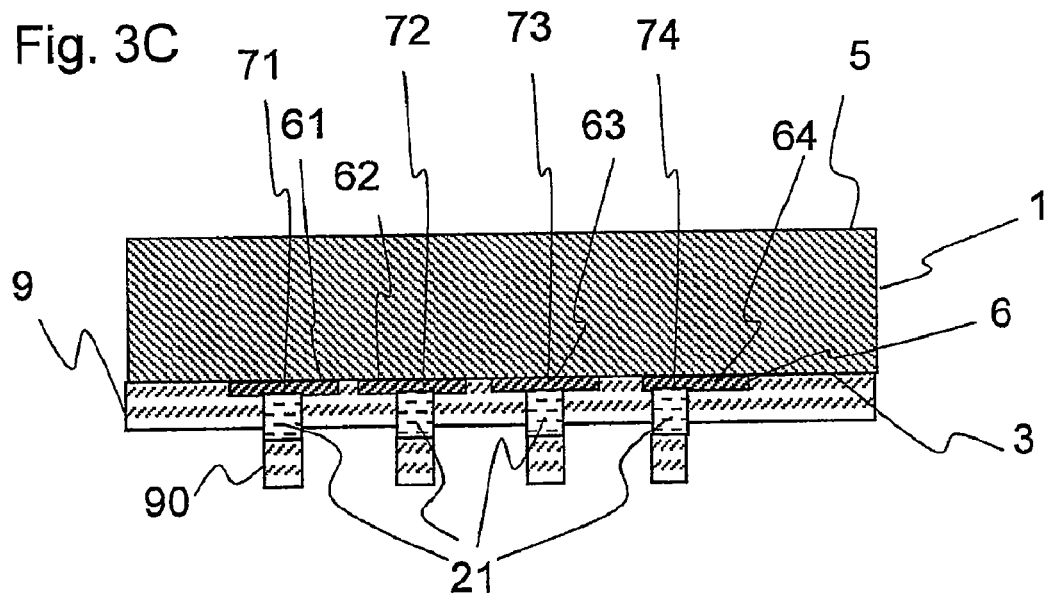

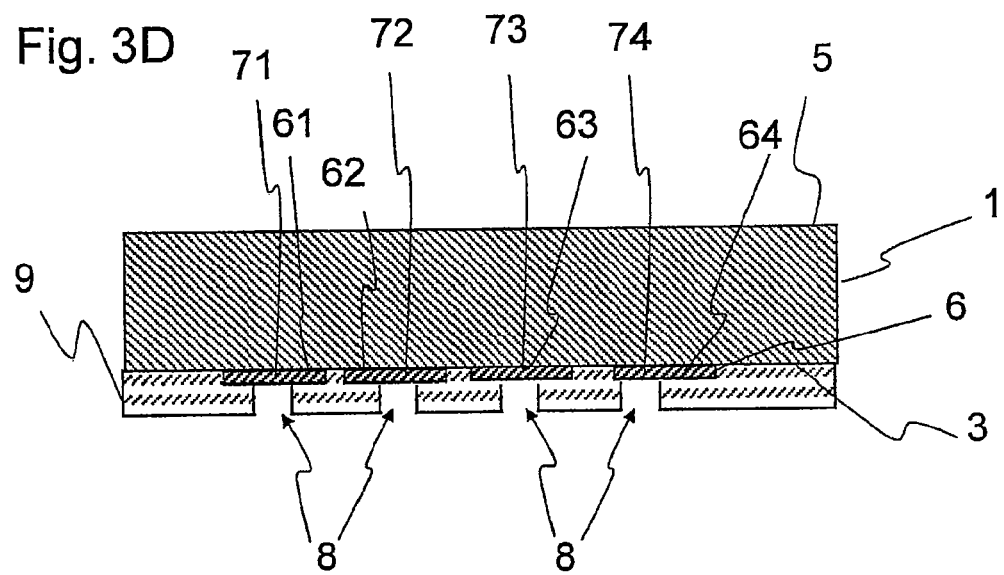
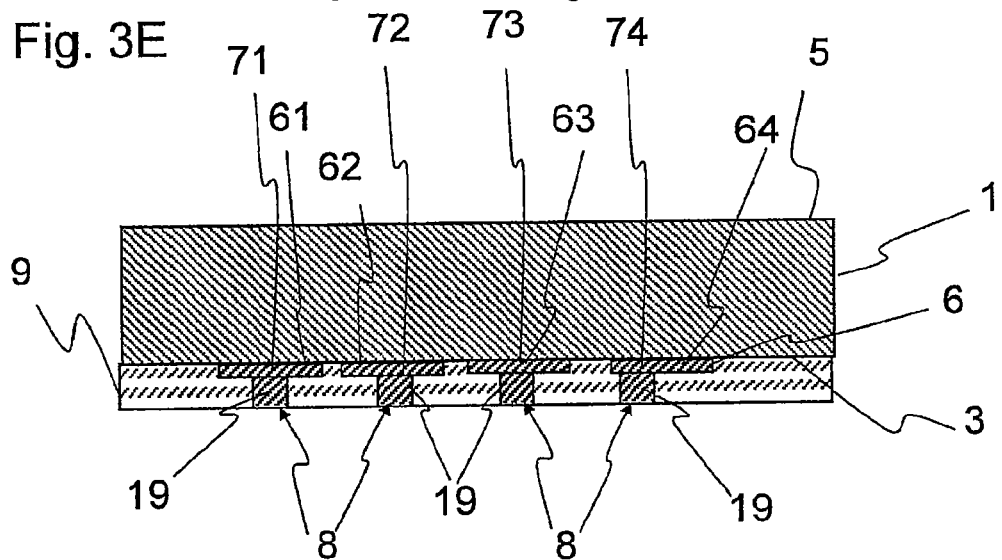
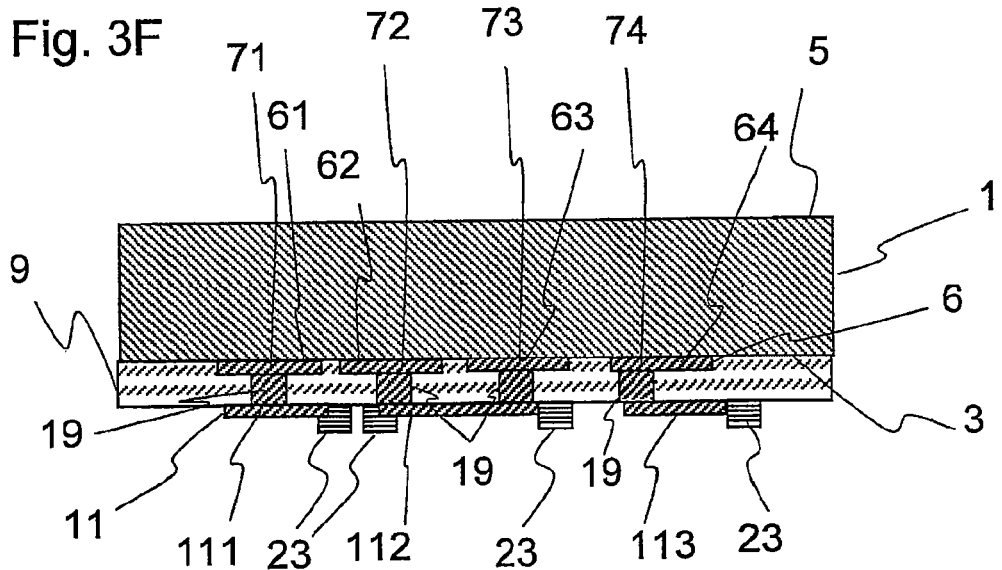

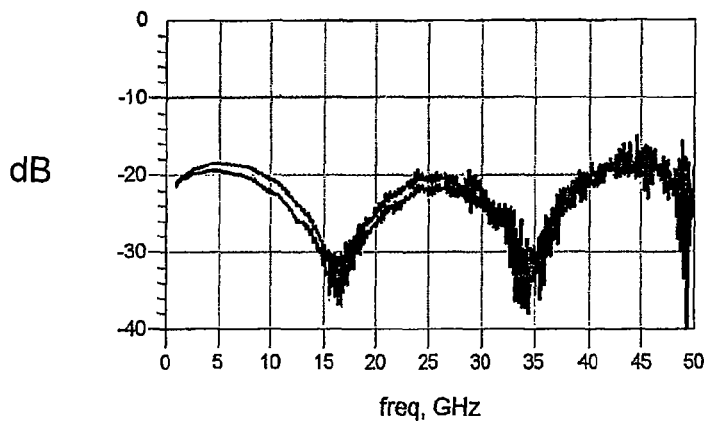
Fig. 8: Magnitude of the scatter parameters S11 for specimen 1
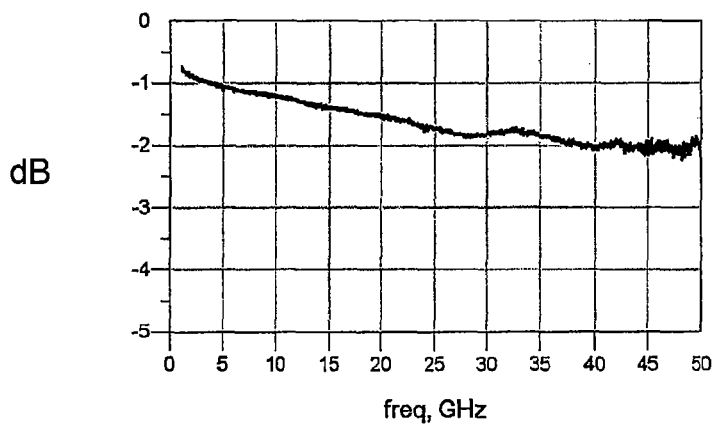
Fig. 9: Magnitude of the scatter parameters S21 for specimen 1
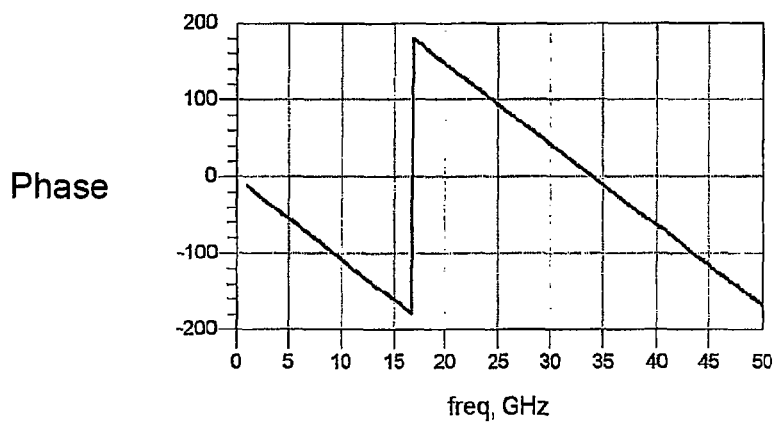
Fig. 10: Phase profile S21 for specimen 1

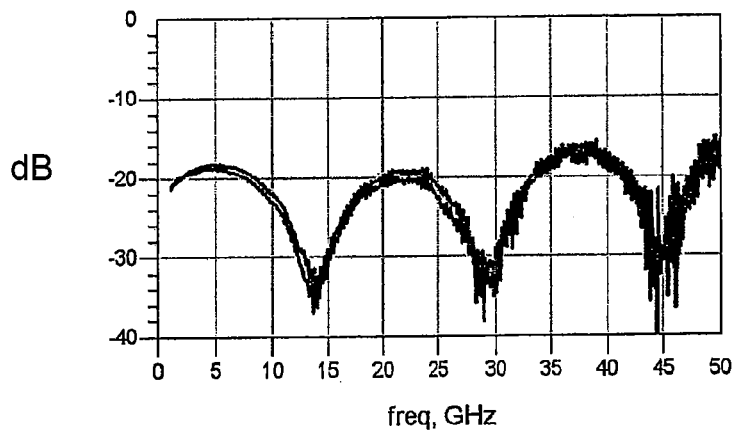
Fig. 11: Magnitude of the scatter parameters S11 for specimen 2
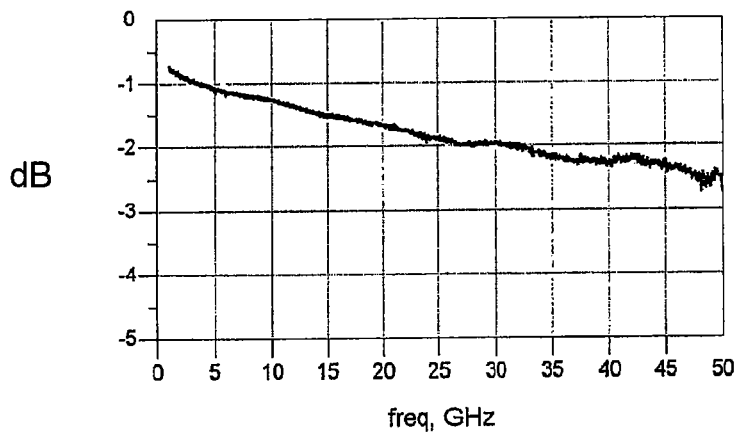
Fig. 12: Magnitude of the scatter parameters S21 for specimen 2
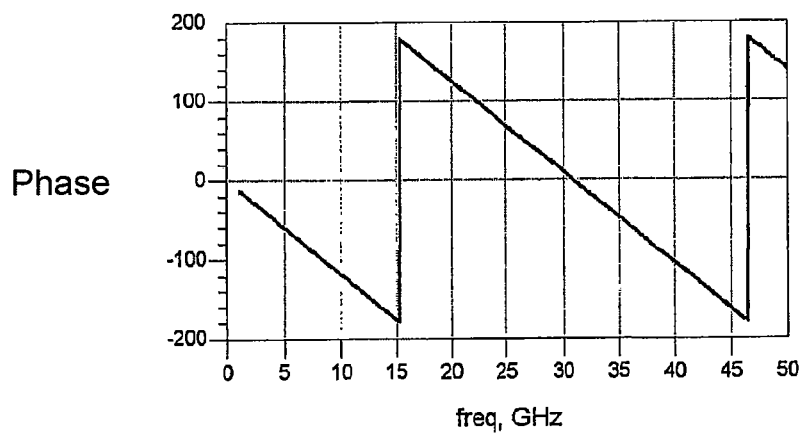
Fig. 13: Phase profile S21 for specimen 2

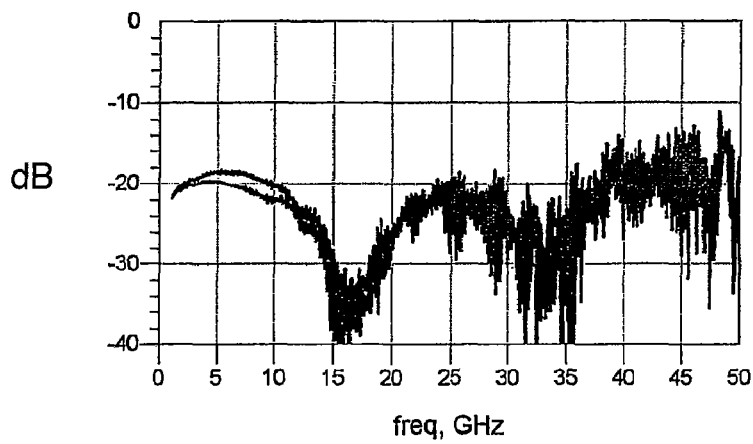
Fig. 14: Magnitude of the scatter parameters S11 for specimen 3
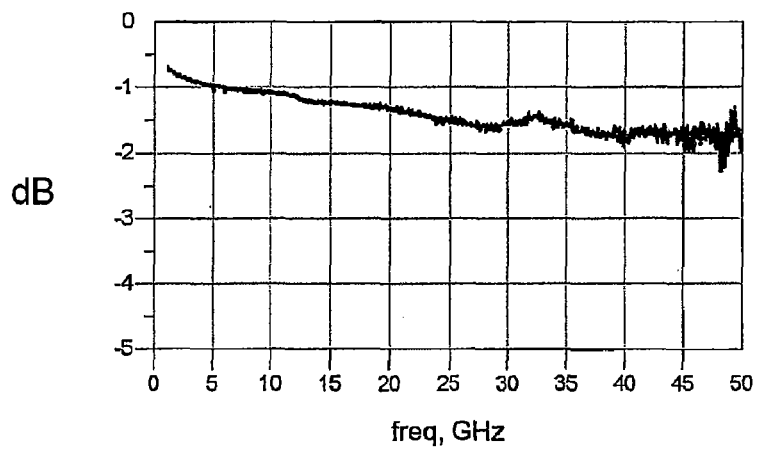
Fig. 15: Magnitude of the scatter parameters S21 for specimen 2
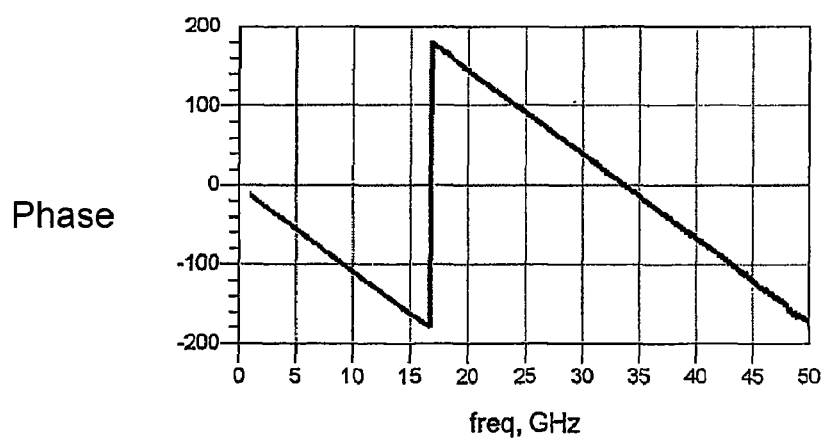
Fig. 16: Phase profile S21 for specimen 3

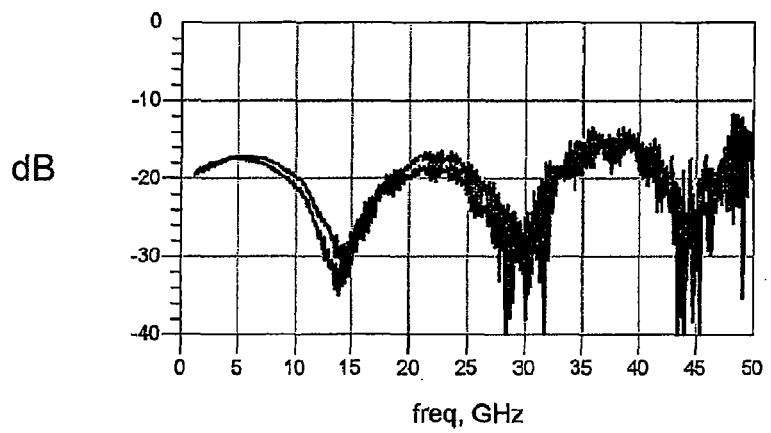
Fig. 17: Magnitude of the scatter parameters S11 for specimen 4
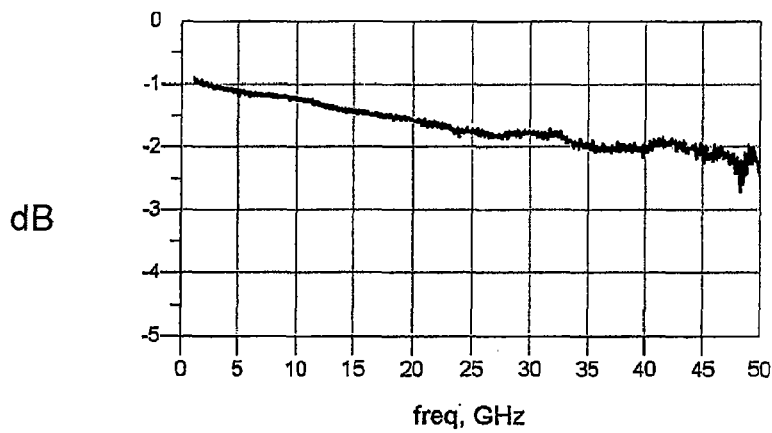
Fig. 18: Magnitude of the scatter parameters S21 for specimen 4
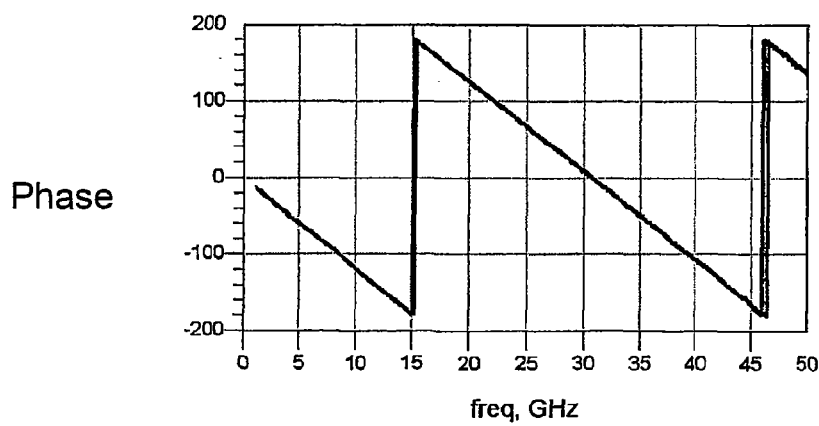
Fig. 19: Phase profile S21 for specimen 4

METHOD FOR PRODUCING A COMPONENT COMPRISING A CONDUCTOR STRUCTURE THAT IS SUITABLE FOR USE AT HIGH FREQUENCIES

BACKGROUND OF THE INVENTION

1. Field of the Invention

The invention deals in general terms with the field of radio-frequency circuits, and in particular the invention relates to a process for producing conductor structures which are suitable for radio-frequency applications on a substrate, and to a component having conductor structures suitable for radio-frequency structures.

2. Description of Related Art

It is known that the trend in the semiconductor industry is toward ever higher data transmission rates. Frequencies in the gigahertz range lead to increased signal attenuation at the feed and emission systems. Hitherto, primarily printed ceramic (HTCC) and glass-ceramic (LTCC) multiple layers, which after they have been printed with conductive layers, laminated and sintered, realize a three-dimensional or multilayer wiring for a radio-frequency circuit, have been used for systems of this type. Moreover, organic multiple layers which are not hermetic are also used.

However, at high frequencies, the transmission losses in wiring systems of this type increase on account of the attenuation in the interconnects. One cause of the high attenuation is the application of the interconnects, usually by means of thick-film technology, in particular by means of screen printing. The interconnects produced using this technology have a considerable inhomogeneity of the interconnect contours. The inhomogeneities of the interconnects act as antennas, leading to extensive losses through radiation.

Also, the applications for the HTCC and LTCC materials used are limited with regard to their radio-frequency properties, in particular the dielectric constant (DK) and dielectric loss (tanδ) values, and consequently radio-frequency wirings employed hitherto with HTCC or LTCC layers can only be used up to frequencies of at present 40 GHz. The HTCC and LTCC ceramics have an inevitable granularity which has an adverse effect on the radio-frequency properties and leads to the interconnects integrated therein having a surface contour corresponding to the granularity, which likewise leads to line losses.

Furthermore, sintering inevitably leads to shrinkage of the substrates, which makes it difficult to accurately maintain desired dimensions.

More recent developments have been toward replacing the disadvantageous thick-film technology by using various PVD processes to apply the interconnects by evaporation coating or sputtering. However, the sintering of the HTCC or LTCC materials to produce the wiring stack required in previous processes still presents a major problem. For example, sintering of an LTCC ceramic requires a temperature of at least 950° C. A temperature of 1500° C. is required even for the sintering of HTCC ceramics. These temperatures lead to changes in the interconnect structures, and the choice of interconnect materials is limited.

BRIEF SUMMARY OF THE INVENTION

The invention is therefore based on the object of providing improved interconnect systems, in particular in terms of the radio-frequency properties.

Accordingly, the invention provides a process for producing a component having a conductor arrangement which is suitable for radio-frequency applications, in which a structured glass layer having at least one opening over a contact-connection region is deposited on a substrate by evaporation coating, and at least one conductor structure is applied to the glass layer, the conductor structure having electrical contact with the contact-connection region.

Accordingly, the process according to the invention can be used to produce a component having a conductor arrangement which is suitable for radio-frequency applications which comprises a substrate having at least one contact-connection region, on at least one side of the substrate, a glass layer of glass deposited by evaporation coating, which has at least one opening with a via which is in electrical contact with the contact-connection region, and at least one conductor structure which is suitable in particular for radio-frequency applications on the glass layer, which is in electrical contact with the via.

In this context, conductor structures which are suitable for radio-frequency applications are to be understood in particular as meaning conductor structures which can conduct and transmit signals with frequencies of higher than 1 GHz.

In this context, the term component is to be understood as encompassing not only an electronic component. In the context of the present invention, the term component also encompasses a coated substrate with a radio-frequency conductor arrangement or radio-frequency conductor system, which then as a unit serves as a carrier and for the connection of further components. Similar components with carrier material and radio-frequency conductor systems are generally also referred to as radio-frequency substrates.

The glass layer can preferably be deposited using an apparatus as described, for example, in the German utility model bearing application number 202 05 830.1, in particular by electron beam evaporation. The content of disclosure of the utility model bearing application number 202 05 830.1 is hereby incorporated in its entirety by reference in the subject matter of the present application.

According to a refinement of the invention, the glass layer is applied by evaporation coating through plasma ion assisted deposition (PIAD). In this case, an ion beam is directed onto the surface which is to be coated during the evaporation-coating process. This leads to further densification and a reduction in the defect density.

When the component according to the invention is produced with a conductor structure which is insulated with respect to the substrate by an insulation layer of evaporation-coating glass, it is possible to dispense with co-firing at high temperatures compared to the production of prior LTCC or HTCC components. This makes it possible, for example, to use materials which it has not hitherto been possible to employ, such as for example aluminum, which do not have to be stable up to the high temperatures required for co-firing.

As well as conductor structures, such as for example interconnects, it is also possible for one or more passive electrical components to be applied to the glass layer and brought into contact with or connected to the conductor structure. By way of example, it is possible for a capacitor, a resistor, a coil, a varistor, a Positive Temperature Coefficient thermistor or PTC, a Negative Temperature Coefficient thermistor or NTC, to be applied to the glass layer as passive electrical component, or for a filter element to be applied to the glass layer.

A particularly advantageous embodiment of the invention provides for the production of a three-dimensional or multilayer conductor system on a substrate. For this purpose, the steps of depositing a structured glass layer and of applying at least one conductor structure are carried out a number of times. The individual glass layers and/or conductor structures may be structured differently in order to produce a three-dimensional conductor system, in particular also having passive components, which are formed on one or more individual layers of the multilayer conductor system. In this case, it is advantageously possible for a conductor structure which is applied at a later stage to be connected to a contact-connection region of a conductor structure applied at an earlier stage, so that an electrical connection is created between two individual layers of the conductor arrangement and the individual layers can be linked to one another. Accordingly, it is thereby possible to form a component which has a multilayer conductor arrangement with at least two glass layers which have been applied by evaporation coating and each have a conductor structure applied to them, with a conductor structure on a first glass layer being in electrical contact with a conductor structure on a second glass layer via a via.

However, it is also possible for two or more vias which are positioned above one another or offset, to be brought into contact in individual glass layers located above one another, so that, by way of example, a contact-connection region of the substrate is through-contacted to the outside through a plurality of glass layers or is connected to a conductor structure of a further layer.

Furthermore, an advantageous embodiment of the process provides for the step of depositing a structured glass layer having at least one opening over a contact-connection region by evaporation coating comprises the steps of:
applying a structured interlayer, with a structure which covers the contact-connection region,
application of a glass layer by evaporation coating to the substrate and the structured interlayer which is present thereon, the thickness of the glass layer preferably being less than that of the structured interlayer, and
removing the structured interlayer, with those regions of the glass layer which are located on the structured interlayer being lifted with it.

The structured interlayer may, for example, be produced by photolithographic structuring of a suitable photoresist. In this way, it is possible, by applying the glass layer by evaporation coating and then lifting it off, to achieve very accurate structuring of the glass layer with well-defined, smooth edges in the region covered by the interlayer. In addition to photolithographic resist structuring, however, it is also possible for an interlayer of this type to be produced directly, for example by printing.

According to a further variant of the process, masking of the substrate is effected by means of a mask located between target and substrate during the evaporation-coating process, for example a mask which is securely bonded to the substrate.

Furthermore, a variant of the process provides for a conductive material which projects with respect to regions adjacent to the contact-connection region and is covered by the structure of the interlayer to be applied to the at least one contact-connection region prior to the application of the glass layer by evaporation coating. This produces a conductive, raised structure on the contact-connection region. This step can be carried out, for example, by the interlayer being photolithographically structured together with a layer of conductive material, in which case the layer of conductive material is removed from the regions which surround the contact-connection region together with the interlayer. The glass layer can then advantageously be applied by evaporation coating in such a way that its thickness substantially corresponds to the thickness of the applied, conductive material, so that after the glass layer above the contact-connection region has been lifted off, a substantially planar surface is present.

According to yet another variant of the invention, first of all, for example as explained above, a glass layer having at least one opening is deposited directly above a contact-connection region or advantageously with a lateral offset, and the at least one opening in the glass layer is then filled with conductive material. This too creates a substantially planar surface as a base for the subsequent application of one or more conductor structures.

Moreover, the application of a conductor structure may advantageously comprise the steps of applying a negatively structured interlayer and then depositing conductive material on the base which has been coated with the interlayer. The base in this case comprises the substrate and/or the substrate with one or more applied glass layers and conductor structures applied thereto. This interlayer may also be photolithographically structured or produced by structured printing.

The conductor structure, for its part, may advantageously be applied by electroplating, sputtering or evaporation coating of electrically conductive material and brought into contact with the contact-connection region of that surface of the base which is covered by the insulating glass layer.

The substrate itself may already have a conductor structure, for example in the form of interconnects. These may also advantageously be applied directly to the substrate prior to the step of depositing the structured glass layer. In particular, it is then possible for a contact-connection region to be provided on an interconnect which has been applied direct to the substrate, and for this contact-connection region then to be brought into contact with a conductor structure which is subsequently applied to an insulating glass layer. It is in this way possible to create a multilayer interconnect system which is suitable for radio-frequency applications, or a multilayer conductor arrangement which is suitable for radio-frequency applications, after the steps of depositing a glass layer and then applying at least one conductor structure to the glass layer have been carried out just once. Of course, in this context it is still possible to create further layers of a three-dimensional interconnect system, in particular also with passive components integrated therein, by repeatedly carrying out the steps of depositing a glass layer and applying a conductor structure.

According to a refinement of the process, when the conductor structure is being produced it is also possible for structures comprising different conductive and/or semiconducting materials to be applied. The materials may in this case also be combined with insulating structures. Combinations of this type allow further passive and active components to be produced in one or more individual layers on the insulating interlayer.

If the single-layer or multilayer conductor arrangement on the substrate is complete, it is additionally possible for a further glass layer to be deposited by evaporation coating so as to cover the layers which have previously been applied. To allow contact-connection of the conductor arrangement on the substrate, it is advantageously possible to create at least one via through the glass layer. This glass layer can be produced in the same way as the glass layers of the conductor arrangement beneath it. This further layer can serve as an insulation layer which insulates the conductor arrangement with respect to the outside. Moreover, the layer of glass deposited by evaporation coating is also eminently suitable as an encapsulation for hermetic packaging of the component.

Moreover, it is also possible for a soldering bead to be applied to the via in the outer glass layer, preferably for an arrangement of soldering beads to be applied to a multiplicity of vias, in order to allow the component subsequently to be mounted, for example, on an SMT circuit board and connected.

Moreover, one embodiment of the invention provides for the substrate to comprise a semiconductor substrate with an active semiconductor region, for example in the form of an integrated semiconductor circuit. In this case, the at least one conductor structure can be connected to a connection location on the active semiconductor region while it is being applied.

Hitherto, for example in LTCC modules, the path has been taken of integrating individual semiconductor building blocks in monolithic form in cavities in the ceramic, so that the ceramic forms the carrier for the semiconductor building blocks. By contrast, the invention allows the reverse route to be taken, with the conductor arrangement being applied direct to a chip and the latter therefore serving as carrier for the conductor arrangement.

According to a refinement of this embodiment, the active semiconductor region is arranged on a first side of the substrate, with the deposition of a structured glass layer having at least one opening over a contact-connection region being effected by evaporation coating onto the substrate, and the application of the conductor structure to the glass layer taking place onto the first side of the substrate. In this case, therefore, the applied conductor arrangement with the at least one insulating interlayer comprising glass applied by evaporation coating covers the active side of a semiconductor building block. This allows particularly short line paths and therefore, inter alia, reduces the radiation losses.

Another refinement of the invention provides for the glass layer and the conductor structure to be applied to a second side, which is the opposite side from the first side having the at least one active semiconductor region. To connect the active semiconductor region to the conductor arrangement having the conductor structure, moreover, a via is introduced through the substrate, which is connected to a connection location, arranged on the first side, for the active semiconductor region. The via for its part on the second side is then connected to the conductor structure when the conductor structure is applied. This embodiment is advantageous, inter alia, if a plurality of chips of this type are to be stacked, so that the stacking requires contacts to be shifted onto the opposite side from the active semiconductor region.

Of course, it is possible for a substrate to be provided with a conductor arrangement not only on one side. According to yet another advantageous refinement of the invention, in fact, the component has a conductor arrangement on two opposite sides. In this case, as in the other embodiments, the conductor arrangement comprises a glass layer of glass applied by evaporation coating, the glass layer having at least one opening with a via which is in electrical contact with a contact-connection region located beneath the glass layer, and at least one conductor structure on the glass layer, which is in contact with the via.

Furthermore, it has proven advantageous if the substrate, during the application of the glass layer by evaporation coating, is held at a temperature of between 50° C. and 200° C., preferably between 80° C. and 120° C. The heating of the substrate inter alia prevents the formation of mechanical stresses. Moderate heating is also advantageous for the morphology of the glass layers; at these substrate temperatures, it was possible to produce particularly pore-free glass layers.

A base pressure in the evaporation-coating chamber which is kept at most in the region of $10^{-4}$ mbar, preferably in the range of $10^{-5}$ mbar or below, is equally positive for the required layer quality.

To produce continuous glass layers with a low pore density on the substrate, moreover, it is expedient if that surface of the substrate which is to be coated has a surface roughness of less than 50 μm.

Yet another advantageous refinement of the process according to the invention provides for the glass layer to be applied by evaporation coating with a deposition rate of at least 0.5 μm of layer thickness per minute. This high deposition rate can readily be achieved without detriment to the layer quality of the glass layers and allows a short production time to be implemented. Other vacuum deposition processes, such as for example sputtering, by contrast, only achieve deposition rates of a few nanometers per minute. Depending on the particular application, the layer thickness of an evaporation-coating glass layer may be between 0.05 μm and 1.5 mm, preferably in a range from 0.1 μm to 0.1 mm.

Particularly suitable evaporation-coating glasses are in particular glasses which comprise an at least binary system of materials. Glass layers which have been deposited through evaporation of glasses of this type have particularly good encapsulation and radio-frequency properties on account of their lack of defects.

To make the process even more efficient and to accelerate the production process, according to yet another advantageous and preferred refinement it is possible for the substrate to be coated while it is still joined to the wafer. The individual components are then obtained by dicing the substrate.

Suitable substrate materials include, inter alia, silicon, ceramic, glass or even plastic. It is also possible to use composite materials, for example glass-plastic laminates, in particular also having integrated conductor arrangements. In addition to silicon, it is also possible, for example, to use other semiconductor materials, such as for example gallium arsenide. Silicon, glass and ceramic are also particularly suitable substrate materials on account of their coefficient of thermal expansion being very similar to that of the glass which has been applied by evaporation coating.

The international patent application filed by the Applicant on the same date as the present application entitled "Glass material for radio-frequency applications" describes glass materials which can be used in particular also for the processes and components described here, and the content of disclosure of this application entitled "Glass material for radio-frequency applications" with regard to the glass materials disclosed therein is hereby expressly incorporated by reference.

In the text which follows, the invention is explained in more detail on the basis of exemplary embodiments and with reference to the drawings, in which identical and similar elements are provided with identical reference numerals and the features of various embodiments can be combined with one another.

BRIEF DESCRIPTION OF THE SEVERAL VIEWS OF THE DRAWINGS

In the drawings:

FIGS. 8 to 10 show the magnitude of the scatter parameters and their phase profile for specimen 1, FIGS. 11 to 13 show the magnitude of the scatter parameters and their phase profile for the specimen 2, FIGS. 14 to 16 show the magnitude of the scatter parameters and their phase profile for the specimen 3, and FIGS. 17 to 19 show the magnitude of the scatter parameters and their phase profile for the specimen 4.

DETAILED DESCRIPTION OF THE INVENTION

Figure 1:
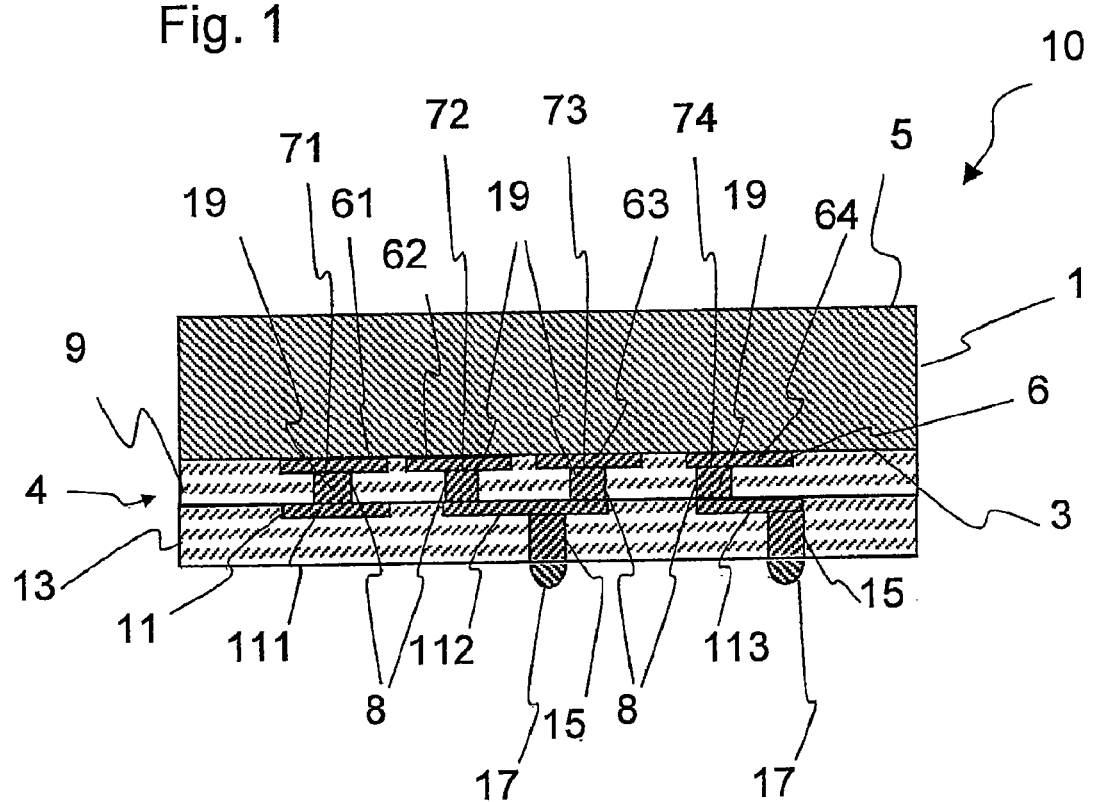
FIG. 1 shows a sectional illustration of a first embodiment of the invention.

FIG. 1 shows a simplified sectional illustration of a first embodiment of a component according to the invention, which is denoted overall by reference numeral 10 and has a substrate 1 with a first side 3 and a side 5 on the opposite side from the side 3, as well as a conductor arrangement which is arranged on the first side 3 of the substrate and is denoted overall by reference numeral 4. A layer 6 comprising conductor structures 61-64 is arranged on the substrate. The conductor structures 61-64 may, for example, be interconnects. Moreover, some of the conductor structures 61-64 may also be formed as passive electrical components. Contact-connection regions 71-74 are defined on these conductor structures 61-64 on the first side 3 of the substrate 1. After the conductor structures of the layer 6 have been applied, an insulating glass layer 9 is then deposited in structured form on the first side 3 of the substrate by evaporation coating, such that this glass layer has openings 8 above the contact-connection regions 71-74. These openings 8 are filled with a conductive material 19, so that the openings in combination with the conductive fillings in each case create vias through the insulating glass layer 9. A layer 11 with further conductor structures 111, 112, 113 is applied to the glass layer 9. The conductor structures 111, 112, 113 are each in contact with at least one of the vias, so that the conductor structures 111, 112, 113 are electrically connected to the conductor structures 61-64 of the layer 6. Consequently, the substrate has a multilayer conductor arrangement, the individual layers 6 and 11 of which are separated from one another by an insulating glass layer 9 with excellent radio-frequency properties.

Glasses which have the following composition ranges, in percent by weight, have proven particularly suitable as evaporation-coating glasses for a component 10 according to the invention:

| Components | Glass range 1 | Glass range 2 |
| --- | --- | --- |
| $SiO_2$ | 75-85 | 65-75 |
| $B_2O_3$ | 10-15 | 20-30 |
| $Na_2O$ | 1-5 | 0.1-1 |
| $Li_2O$ | 0.1-1 | 0.1-1 |
| $K_2O$ | 0.1-1 | 0.5-5 |
| $Al_2O_3$ | 1-5 | 0.5-5 |

Preferred evaporation-coating glasses from these groups are glasses produced by Schott having the following composition, in percent by weight:

| Components | Glass 1 | Glass 2 |
| --- | --- | --- |
| $SiO_2$ | 84.1% | 71% |
| $B_2O_3$ | 11.0% | 26 |
| % $Na_2O$ | ≈2.0% | 0.5% |
| $Li_2O$ | ≈0.3% | 0.5% |
| $K_2O$ | ≈0.3% | 1.0% |
| $Al_2O_3$ | 0.5% | 1.0% |

The glasses which are preferably used in particular have the properties listed in the table below:

| Properties | Glass 1 | Glass 2 |
| --- | --- | --- |
| $\alpha_{20\text{-}300}$ [$10^{-6}K^{-1}$] | 2.75 | 3.2 |
| Density (g/cm$^3$) | 2.201 | 2.12 |
| Transformation temperature [° C.] | 562° C. | 466° C. |
| Refractive index | $n_D$ = 1.469 | 1.465 |
| Water resistance class according to ISO 719 | 1 | 2 |
| Acid resistance class according to DIN 12 116 | 1 | 2 |
| Alkali resistance class according to DIN 52322 | 2 | 3 |
| Dielectric constant $\epsilon$ (25° C.) | 4.7 (1 MHz) | 3.9 (40 GHz) |
| tan$\delta$ (25° C.) | 45*10$^{-4}$ (1 MHz) | 26*10$^{-4}$ (40 GHz) |

In the text which follows, glass 1 is also referred to as glass 8329, and glass 2 is also referred to as G018-189.

A further, final evaporation-coating glass layer 13, which serves as outer insulation for the conductor structures 111, 112, 113, is deposited on the layer 11 comprising the conductor structures 111, 112, 113. To allow contact-connection of these conductor structures, moreover, further vias 15, which are in contact with the conductor structures 111, 112, 113 are present in the final evaporation-coating glass layer 13. In addition, soldering beads 17 are applied to the vias 15 in order for the component 10 to be, for example, secured to an SMT circuit board and connected.

Figure 2:
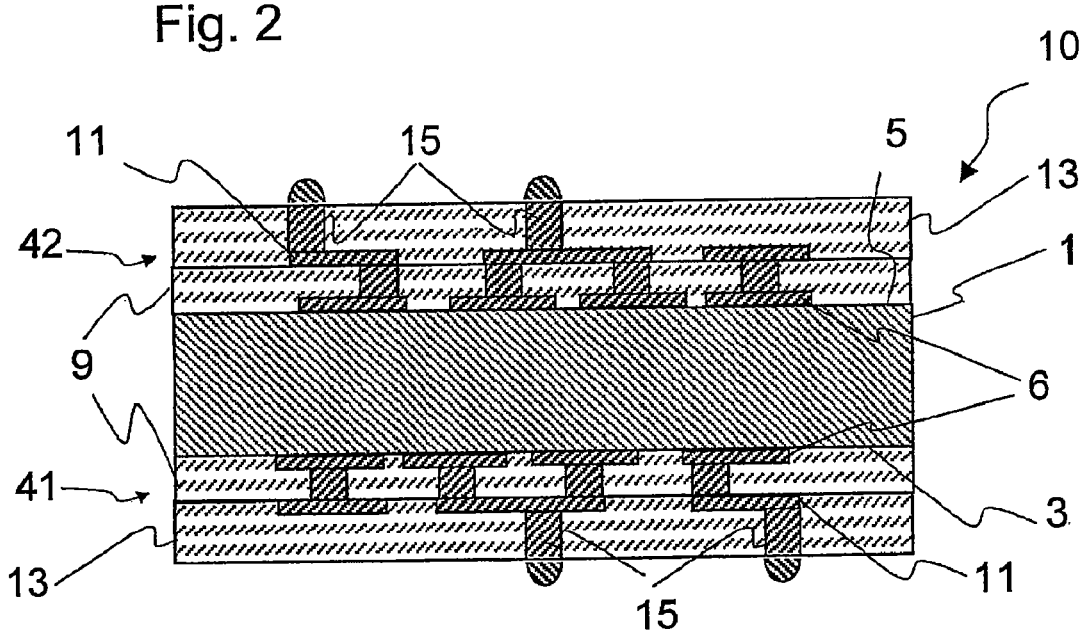
FIG. 2 shows a sectional illustration of a further embodiment of the invention with two conductor arrangements on opposite sides of a substrate, FIGS. 3A to 3H use cross-sectional views to illustrate the steps involved in one embodiment of the process according to the invention.

FIG. 2 shows a sectional illustration of a further embodiment of a component 10 according to the invention. This embodiment has a radio-frequency conductor arrangement 41 and 42 on each of two opposite sides 3 and 5, respectively. The conductor arrangements 41 and 42 are of analogous construction to the conductor arrangement 4 of the embodiment illustrated in FIG. 1.

In detail, the conductor arrangements 41 and 42 once again in each case have a glass layer 9 of glass applied by evaporation coating with openings in which there is conductive material for via purposes in electrical contact with contact-connection regions arranged beneath the openings. Layers 6 with conductor structures, which for their part are in contact with the vias, are in each case arranged on the glass layers 9 of the conductor arrangements 41 and 42. Also as in the embodiment shown in FIG. 1, the conductor structures on the glass layer 9 are covered with further, final evaporation-coating glass layers 13, in which there are vias 15 for connection of the component.

FIGS. 3A to 3H use cross-sectional views to show the steps involved in the production of a component according to the invention in accordance with one embodiment of the process according to the invention.

FIG. 3A shows a substrate 1 following a first processing step, in which a layer 6 comprising conductor structures 61-64, such as in particular suitable interconnects, is produced on the side to which the radio-frequency conductor arrangement is applied. These conductor structures may, for example, be contact locations of electronic components of the substrate, which are not shown in FIG. 3A or may be connected to such contact locations.

Then, in further process steps, a glass layer is deposited, this glass layer having openings above contact-connection regions 71-74 of the surface below. For this purpose, first of all, as illustrated on the basis of FIG. 3B, in a further step a structured interlayer 20 having structures 21 which cover the corresponding contact-connection regions 71-74 is applied. This is preferably realized by photolithographic structuring of a suitable photoresist coating. Alternatively, however, it is also possible to use another process, such as for example printing of the surface, to produce the structures 21.

Then, as illustrated by FIG. 3C, a glass layer 9 is applied by evaporation coating, this glass layer covering both the contact-connection regions 71-74, which are covered by the structures 21 of the interlayer, and the surrounding regions of the surface of the carrier. In this context, it is preferable for the thickness of the glass layer 9 to be less than the thickness of the structured interlayer. The interlayer is then removed, with the regions 90 of the glass layer 9 which cover the structures 21 of the interlayer or are located on the structured interlayer being lifted off with it.

FIG. 3D shows the substrate following this step, which accordingly now has a glass layer 9 with openings 8 above the contact-connection regions 71-74 of the surface below. The openings 8 can then, as shown in FIG. 3E, be filled, for example, with a conductive material 19. Then, a layer 11 comprising conductor structures 111, 112, 113 and passive components 23 can be applied to the glass layer 9, as shown in FIG. 3F. The components 23 may, for example, comprise a capacitor, a resistor, a coil, a varistor, a PTC, an NTC or a filter element. Capacitors and coils can in particular also be realized by conductor structures of individual layers positioned on top of one another and insulated from one another by an evaporation-coating glass layer. By way of example, a conductor structure of the individual layer 6 and a further conductor structure, located above it, of the individual layer 11 can be used for this purpose.

The conductor structures can be applied, for example, by application of a further, negatively structured interlayer and the deposition of electrically conductive material, the conductor structures 111, 112, 113 coming into contact with the conductive material 19 in the openings 8, so that an electrical connection or an electrical contact with the respectively associated contact-connection regions 71-74 is also produced.

The conductor structures may also have structures comprising different conductive materials or also semiconductor materials, for example by the application of the conductor structures being carried out in a plurality of steps using different materials. This also allows further functionalities to be integrated into the conductor arrangement, for example thereby creating semiconductor-metal contacts or thermoelectric contacts.

The production of the vias through the glass layer 9 using conductive material 19 shown in FIG. 3E and the application of the conductor structures illustrated in FIG. 3F may also be carried out in a single step. By way of example, the conductor structures 19 can be produced by electroplating, so that the material which is deposited first of all, starting from the contact-connection regions 71-74, fills the openings 8 and then continues to grow on the surface of the glass layer 9, where it forms the conductor structures and also, if intended, may form the passive components 23. It is also possible for the conductor structures 111, 112, 113 to be produced by evaporation coating or sputtering, in which case it is also possible for the contact-connection regions 71-74 and edges of the openings 8 to be coated, so that the corresponding conductor structures come into electrical contact with the contact-connection regions 71-74.

The interlayer can then be removed again, with conductive material which has been deposited on the interlayer also being lifted off and the intended conductor structures and any applied components, including the surface of the glass layer 9, remaining in place.

The steps, shown in FIGS. 3B to 3F, of depositing a structured glass layer having openings over contact-connection regions by evaporation coating onto the substrate and applying conductor structures which are in electrical contact with associated contact-connection regions can then be repeated in order to produce further layers of the conductor arrangement, in which case a conductor structure which is applied at a later stage can be brought into contact with a contact-connection region of a conductor structure applied at an earlier stage.

Figure 3G:
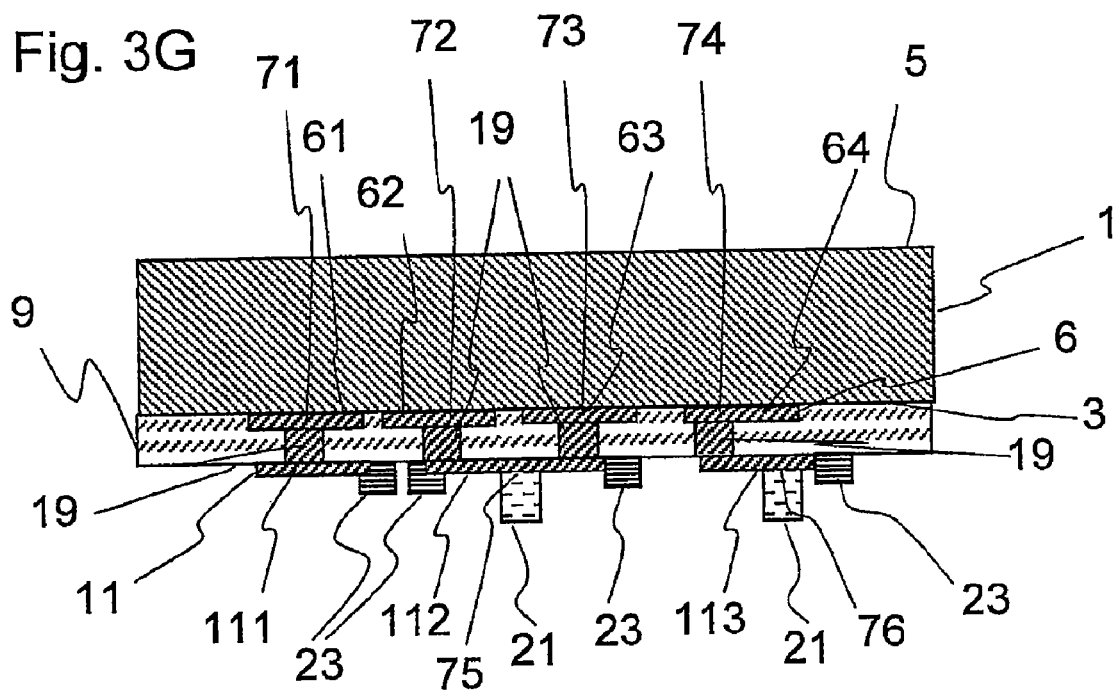
Figure 3H:
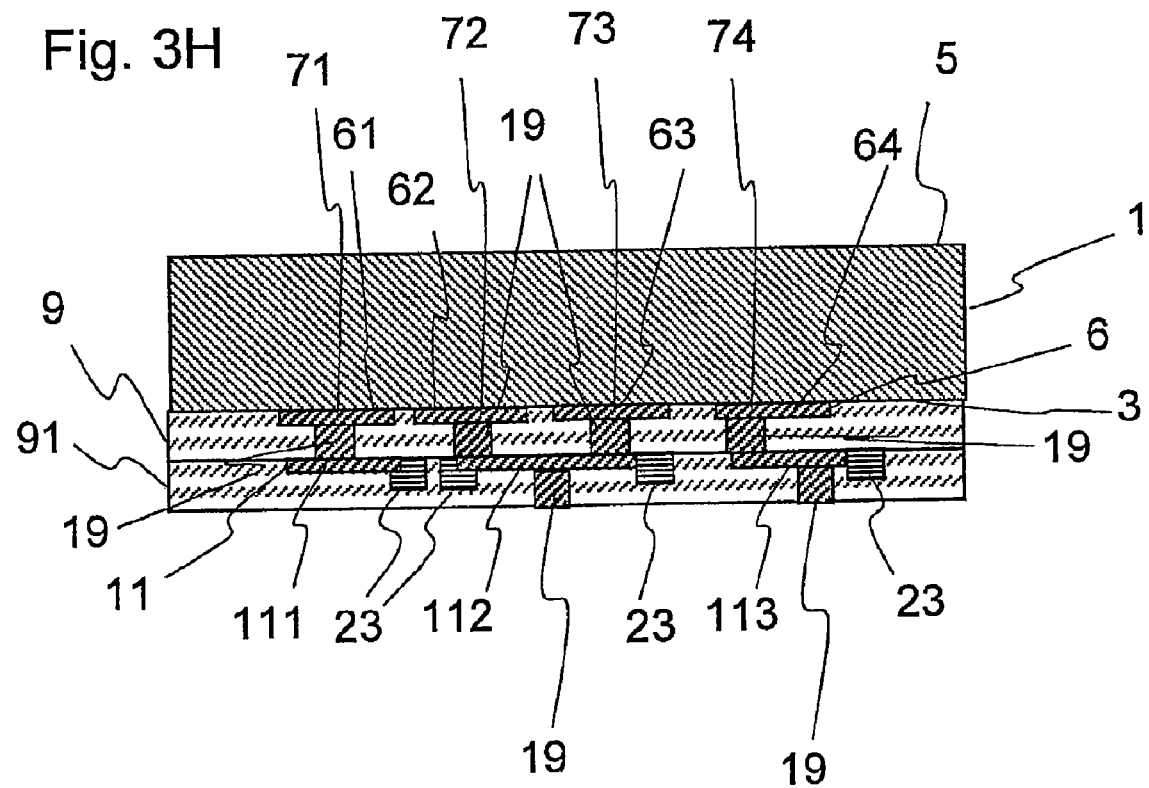

For this purpose, once again, as shown in FIGS. 3F to 3H, an interlayer with structures 21 is applied to intended contact-connection regions 75, 76 of the surface of the coated substrate 1, the contact-connection regions expediently being located on applied conductor structures or also on vias. Then, a further insulating glass layer 91 with vias through openings in the glass layer 91 is produced over the contact-connection regions 75, 76, the production being carried out analogously to the process steps which have been described with reference to FIGS. 3C to 3E.

FIGS. 4A to 4E show a variant of the process steps of the process according to the invention which have been shown with reference to FIGS. 3B to 3E. This variant of the process according to the invention is based on a conductive material, which projects with respect to regions adjacent to the respective contact-connection region and is covered by the structure of the interlayer, being applied to the contact-connection regions prior to the application of the glass layer by evaporation coating. This conductive material subsequently forms the via.

Figure 4A:
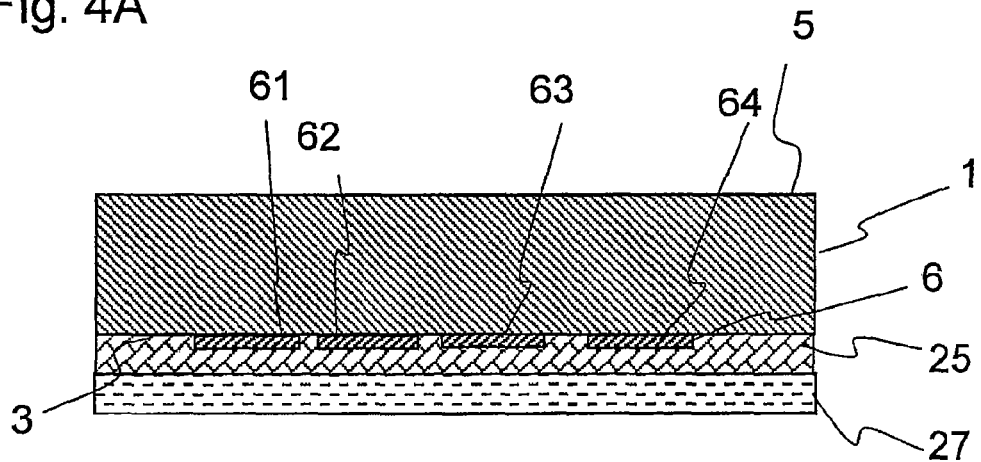
FIGS. 4A to 4E show a variant of the process steps of the process according to the invention illustrated in FIGS. 3B to 3E, FIGS. 5 to 7 show embodiments of components according to the invention which have been provided with a conductor arrangement while still joined to the wafer.

In detail, first of all, starting from a substrate 1 which has been prepared as in FIG. 3A, a conductive layer 25 is formed, followed by a photographically structurable interlayer 27, as illustrated with reference to FIG. 4A.

Figure 4B:
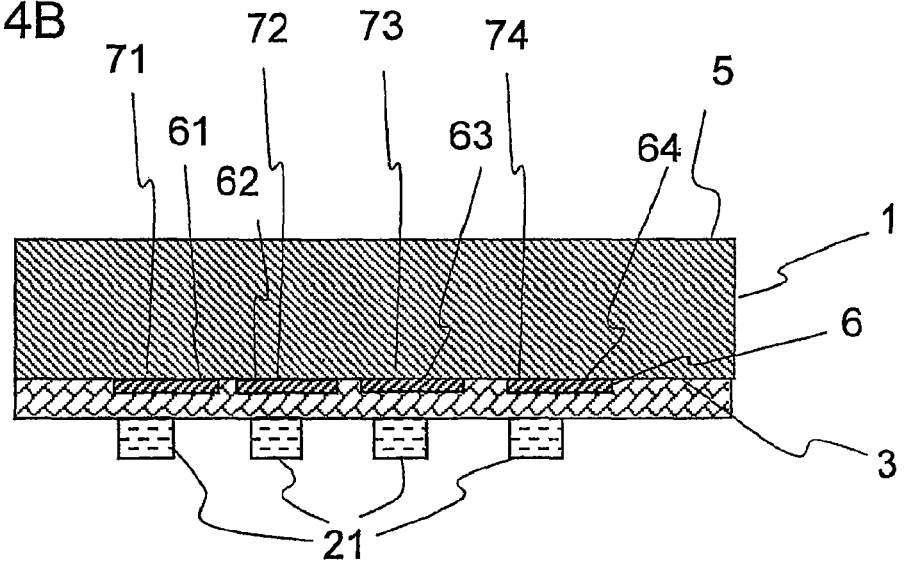
Figure 4C:
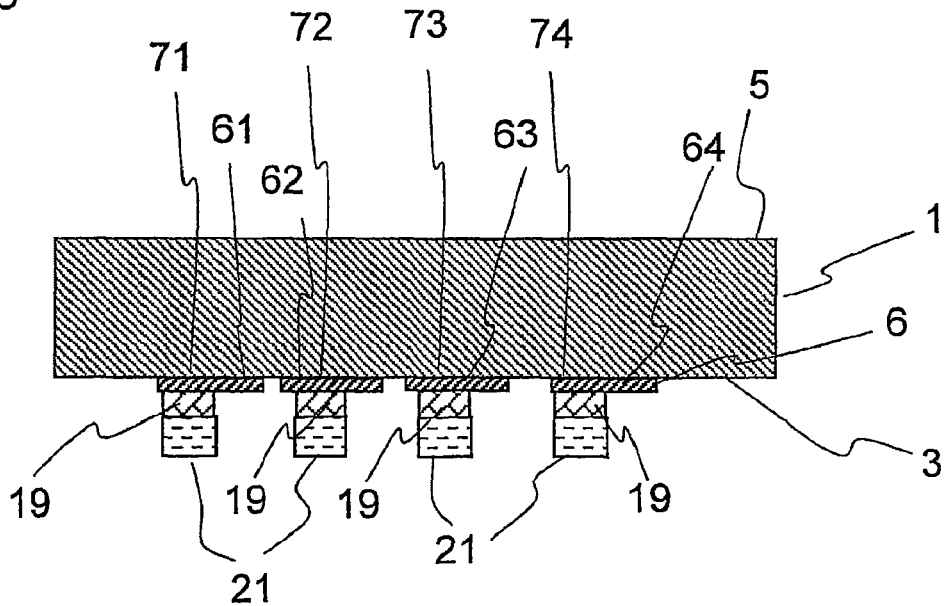

FIG. 4B shows the substrate after photolithographic structuring of the interlayer 27. The layer is structured in such a way that structures 21 which cover the intended contact-connection regions 71-74 remain in place. Then, as shown in FIG. 4C, the conductive layer 25 is removed from the uncovered regions surrounding the contact-connection regions 71-74. This can be carried out in a manner which is in standard usage in the specialist field, for example by etching. Accordingly, the contact-connection regions 71-74 are covered by a conductive material which is elevated or projects with respect to regions adjacent to the respective contact-connection region and which is in each case covered by a structure 21 of the interlayer 27.

Figure 4D:
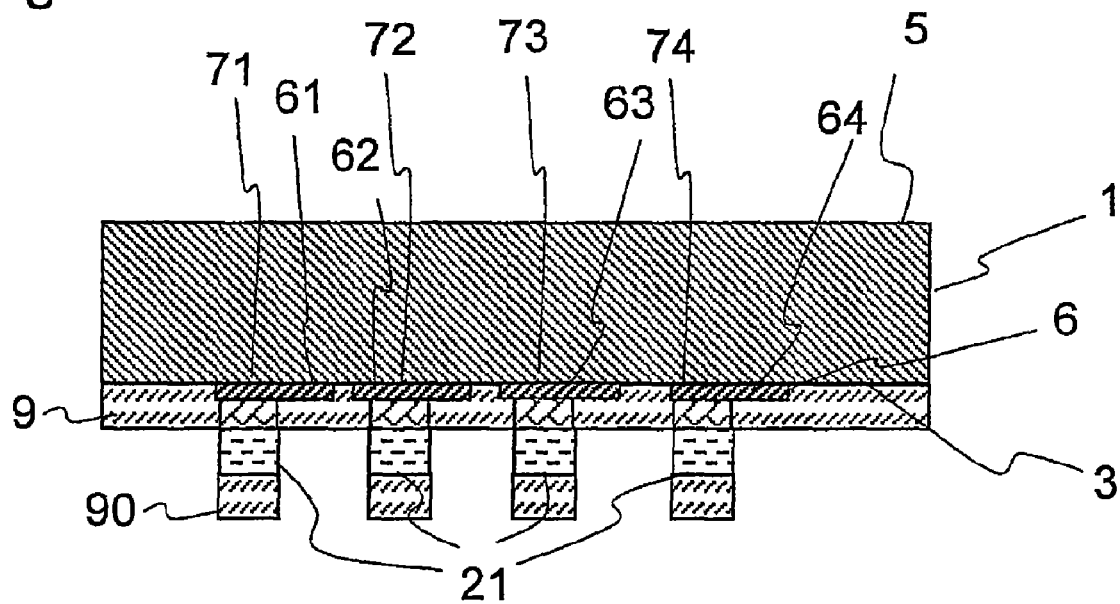
Figure 4E:
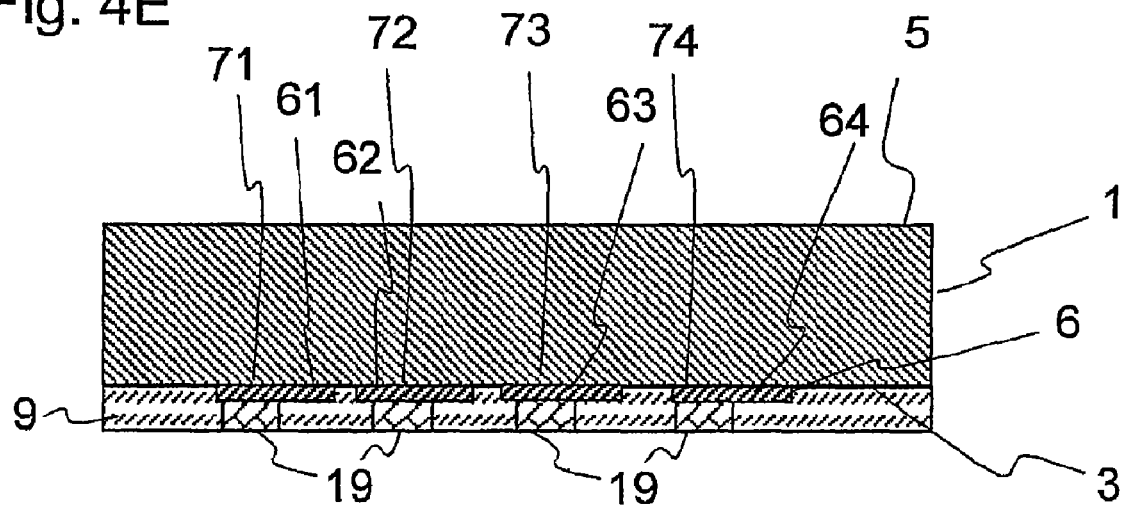

Then, as shown in FIG. 4D, the insulating glass layer 9 is applied by evaporation coating, the thickness of the glass layer 9 preferably being selected in such a way that it approximately corresponds to the thickness of the elevated conductive material 19. Finally, the structures 21 of the interlayer are removed, for example using a suitable solvent, and in the process the regions 90 of the glass layer 9 which cover the structures 21 are lifted off. The result is a substrate having a glass layer which has openings above the respective contact-connection regions and vias in the form of the conductive material located in the openings. This processing state is illustrated in FIG. 4E. As a result of appropriate selection of the layer thickness of the glass layer 9, which is matched to the thickness of the conductive material 19, the surface of the conductive material 19 and of the glass layer 9 are at approximately the same height, resulting in a planar surface. The process can then be continued as explained with reference to FIGS. 3F to 3G, wherein the second glass layer 91 in FIG. 3G and any further glass layers can be produced with vias in the same or a similar way to that which has been explained with reference to FIGS. 4A to 4E.

Figure 6:
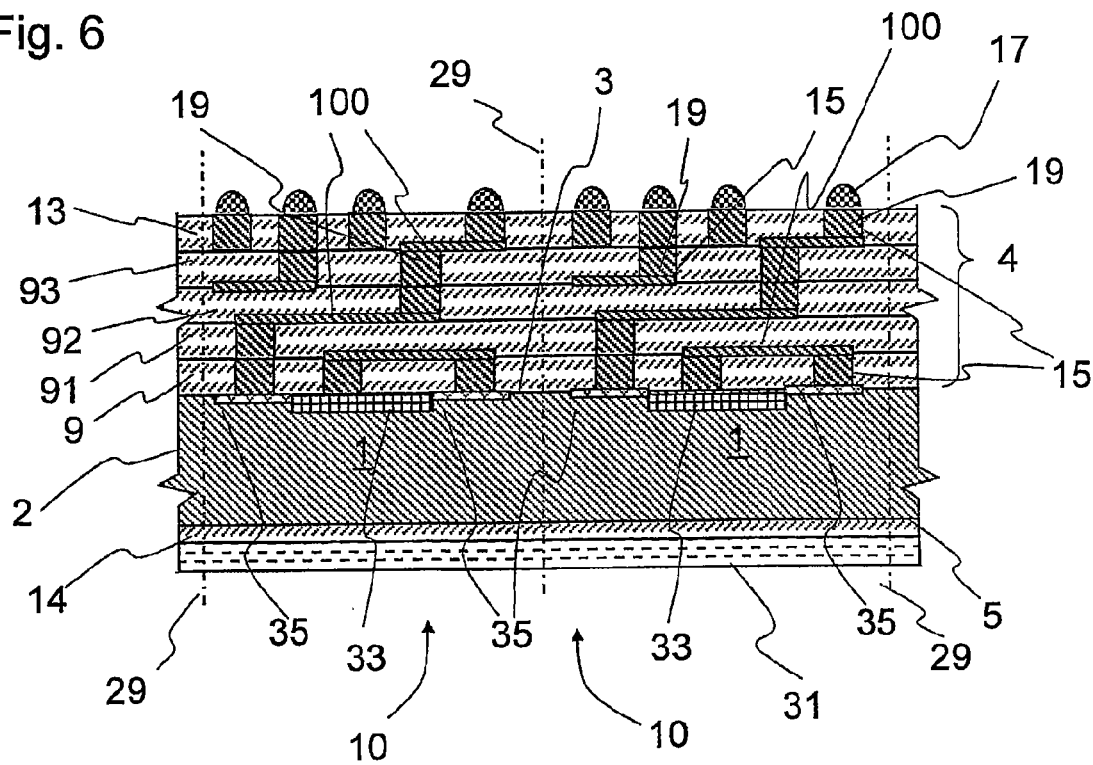
Figure 7:
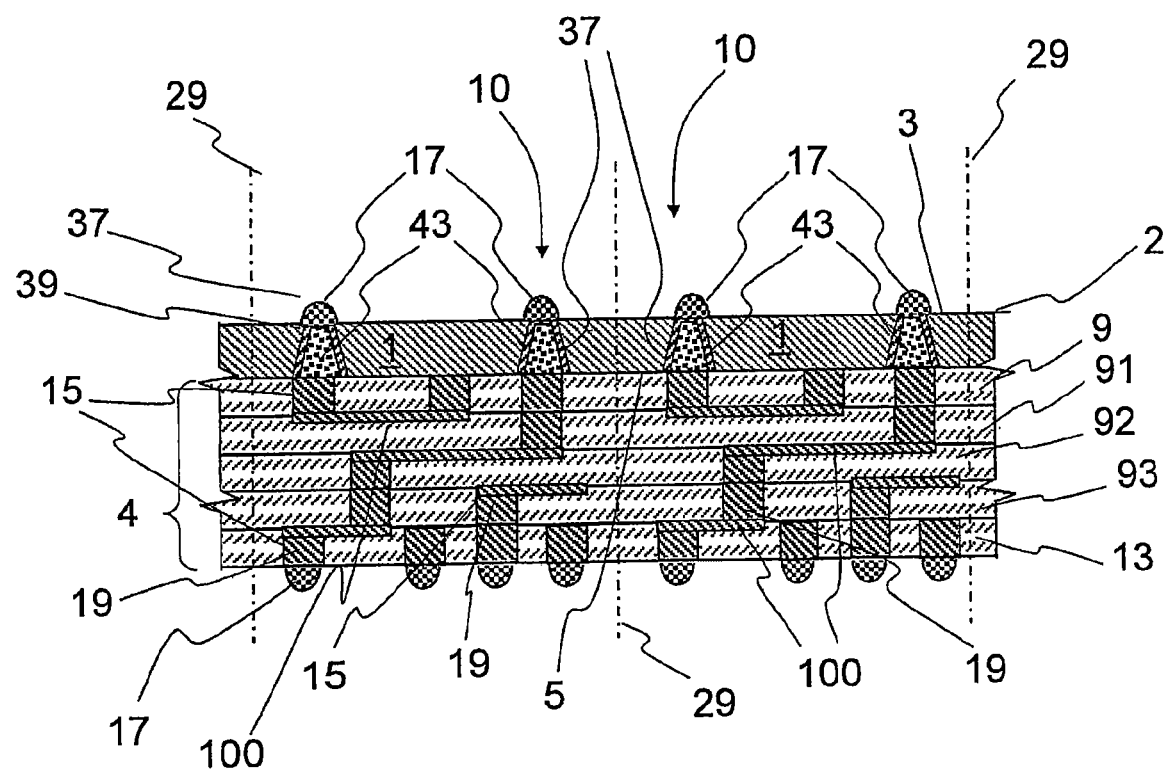

According to an advantageous refinement of the process, the components 10 are produced by coating substrates while they are still joined to the wafer. In this respect, FIGS. 5 to 7 show various embodiments of coated wafers 2, the components being obtained by separating individual substrates 1 from the wafer.

Figure 5:
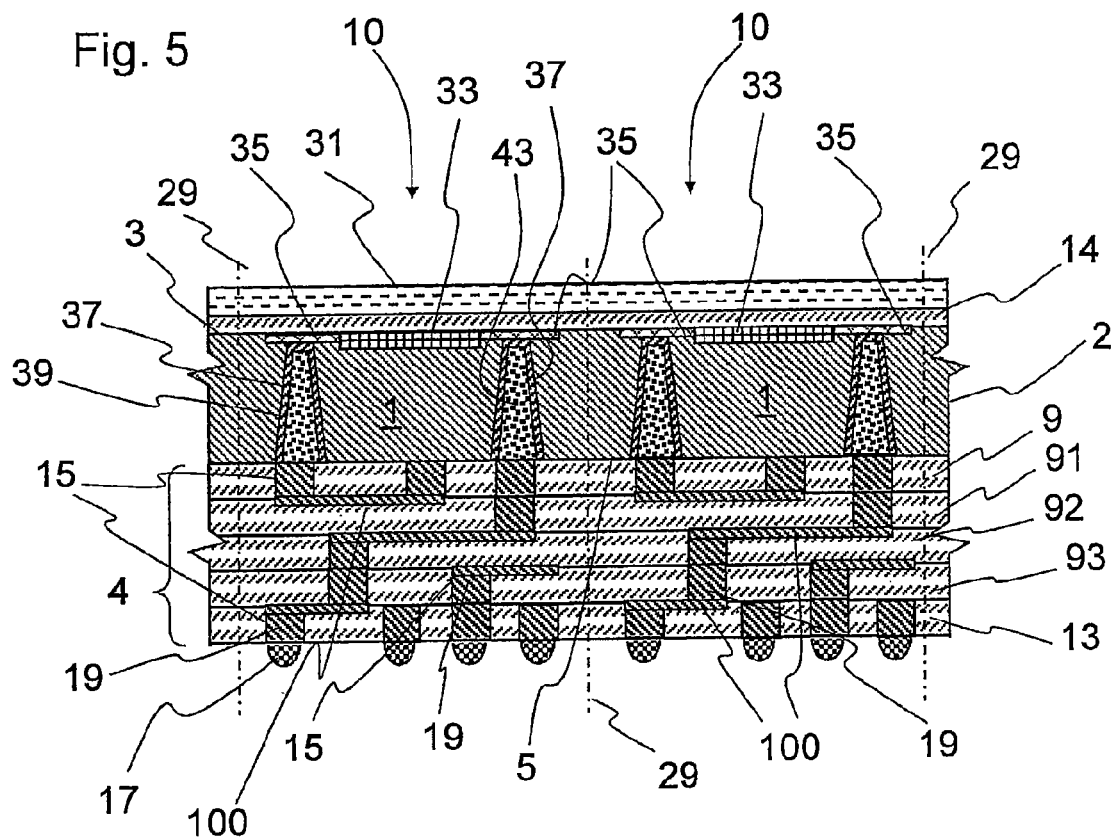

FIG. 5 shows an embodiment of the invention in which a semiconductor wafer 2 has been provided with a sequence of glass and interconnect layers. The wafer material used for this purpose is preferably silicon, since this material has a coefficient of thermal expansion which is very well matched to that of the evaporation-coating glass. Once they have been coated while still joined to the wafer and once the processing state shown in FIG. 5 has been produced, the individual substrates 1 are separated by being divided along the intended separation axes 29, in order ultimately to obtain components 10 with a conductor structure which is suitable for radio-frequency applications.

On a first side 3, the wafer 2 has individual active semiconductor regions 33 which are connected to connection locations 35.

In this embodiment of the invention, the conductor arrangement 4 is arranged on a second side 5 of the wafer 2, or of the substrates 1 of the wafer 2, this second side being on the opposite side from the first side having the active semiconductor regions 33.

The conductor arrangement 4 is illustrated in simplified form for the sake of clarity, with, inter alia, all the conductor structures being denoted here by reference numeral 100. The individual layers of the conductor arrangement 4 may advantageously be produced as has been explained with reference to FIGS. 3A to 3G and/or FIGS. 4A to 4E. In particular, the conductor arrangement 4 shown in FIG. 5 is also produced in multilayer form, for which purpose accordingly the steps of depositing a structured glass layer and applying conductor structures 100 are correspondingly carried out a number of times, and with a conductor structure 100 which is applied at a later stage being brought into contact with a contact-connection region of a conductor structure 100 applied at an earlier stage.

Moreover, vias 37 through the substrates 1, which are electrically connected to the connection locations 35, are introduced into the wafer 2. The via may preferably be produced by etching pits into the wafer from the second side 5 to as far as the preferably metallic connection locations 35, which simultaneously act as an etching stop. Then, a passivation layer 39 is produced on the walls of the etching pit and the etching pit is filled with conductive material 43. The conductive material 43, which is uncovered on the side 3, of the vias 37 serves as a contact-connection region for conductor structures 100 of the conductor arrangement 4.

Moreover, the regions of the surface of the second side 5 having the vias are used as contact-connection regions for some of the conductor structures 100 of the conductor arrangement 4. If these conductor structures 100 are brought into contact with the contact-connection regions during application to the previously deposited glass layer 9, the conductor structures are accordingly also electrically connected to the connection locations 35 on the first side of the substrates 1. In this way, it is then possible for the active semiconductor regions 33 to be supplied via the conductor arrangement and for electrical signals from the active semiconductor regions to be emitted to the conductor structures 100 of the conductor arrangement 4.

To encapsulate and protect the components subsequently obtained by separation from the wafer, the embodiment shown in FIG. 5 is also provided with an additional encapsulation layer 14 of evaporation-coating glass and/or a plastics covering 31 on the side 3.

FIG. 6 shows a further embodiment of the invention, in which substrates which are likewise joined to the wafer have been coated with a conductor arrangement 4. This embodiment of the invention is similar to the embodiment shown in FIG. 5. A semiconductor wafer 2 with active semiconductor regions 33, which are assigned to individual substrates 1, is also used in the embodiment shown in FIG. 6. As in the embodiment shown in FIG. 5, during application of the conductor structures 100 to the first glass layer 9 of the conductor arrangement 4, the connection locations 35 of the active semiconductor regions 33 are connected to conductor structures 100.

Unlike in the embodiment shown in FIG. 5, however, the glass layers 9, 91, 92, 93 and 13 of the conductor arrangement 4 are applied by evaporation coating to the first side 3 of the substrates 1, on which the active semiconductor regions 33 are also arranged. The vias 15 in the bottom glass layer 9 of the conductor arrangement 4 are applied direct to the contact locations 35, with the contact locations 35 accordingly forming the contact-connection regions of the substrates 1 for the corresponding conductor structures 100 on the first glass layer 9.

The components 10 which are obtained by separation from the coated wafers 2, as illustrated by way of example in FIGS. 5 and 6, may, for example, be designed as radio-frequency transmission/reception modules for frequencies above 10 GHz.

FIG. 7 shows yet another embodiment of substrates 1 which have been provided with a radio-frequency conductor arrangement 4 while still joined to the wafer in accordance with the invention. The conductor arrangement 4 comprising the glass layers 9, 91, 92, 93, 13 and the conductor structures 100 has in this case been applied to a wafer whose substrates 1 likewise have vias 37. The components 10 with substrates 1 and conductor arrangements 4, after they have been divided from the wafer, serve as radio-frequency rewiring substrate for further components which can be connected to the external contact locations of the components 10. The external contact locations are for this purpose provided, for example, with soldering beads 17, so that further components can be mounted and connected using surface-mounting technology. The substrates 1 in this case do not have any active components. Accordingly, the substrate wafer 2 may also be made from insulating material, such as for example glass or plastics. A glass which is particularly suitable for use as a material for the wafer or the substrates 1 of the components 10 is Borofloat® glass, which has a coefficient of thermal expansion which virtually coincides with that of the preferred evaporation-coating glass.

The specimen designations for the selected measurements, shown in FIGS. 8 to 19, are to be found in the table below.

| Glass material | Metal material | Waveguide type | Gap width in μm | Strip width in μm | Length in mm | Specimen designation |
|---|---|---|---|---|---|---|
| Glass 1 8329 | Al | Coplanar | 10 | 76 | 5 | specimen 1 |
| Glass 1 8329 | Al | Buried, coplanar | 13 | 76 | 5 | specimen 3 |
| Glass 2 G018-99 | Al | Coplanar | 10 | 76 | 5 | specimen 2 |
| Glass 2 G018-99 | Al | Buried, coplanar | 13 | 76 | 5 | specimen 4 |

FIGS. 8 to 10 show the magnitude of the scatter parameters S11 and S22, S12 and S21, and the phase profile of the scatter parameter S12 and S21 of Specimen 1, which is an open coplanar waveguide using the glass 8329 as an insulator between the aluminum interconnects. The scatter parameters S12 and S21 are also referred to as transmission attenuation and the scatter parameters S11 and S22 as reflection attenuation.

FIG. 8 clearly reveals an extremely low reflection S11 and S22 of the signals at this specimen from −20 dB to −40 dB up to a frequency of 50 GHz. Furthermore, low attenuation values of less than −2 dB for the scatter parameters S12 and S21 are apparent from the measured values illustrated in FIG. 9 up to a frequency of 50 GHz. The scatter parameters S21 and S12, represent the values for the transmission of the electrical signal at the respective frequency. The linear phase profile of the scatter parameter S21 has a very low dispersion up to a frequency of 50 GHz.

The measured values shown with reference to FIGS. 8 to 10 can also be verified by measurements carried out on further specimens, according to which:

FIGS. 11 to 13 show measured values for Specimen 2, which is a buried coplanar waveguide with glass 8329, FIGS. 14 to 16 show measured values for Specimen 3, which is an open coplanar waveguide with glass 8329, and FIGS. 17 to 19 show measured values for Specimen 4, which is a buried coplanar waveguide with glass G018-189.

These measurements reveal a trend toward lower attenuation of the scatter parameters S12 and S21 when using the RF glass G018-189 as in Specimens 3 and 4.

The invention claimed is:

1. A process for producing a component suitable for radio-frequency applications, comprising the steps of:
depositing a structured glass layer having at least one opening over a contact-connection region on a substrate by a vacuum deposition process comprising evaporation coating; and
applying at least one conductor structure to the structured glass layer so that the at least one conductor structure is in electrical contact with the contact-connection region, wherein the step of depositing the structured glass layer comprises the steps of:
applying a structured interlayer to cover the contact-connection region;
evaporation coating the structured glass layer to the substrate and the structured interlayer that is present thereon, wherein the structured glass layer has a layer thickness that is less than an interlayer thickness of the structured interlayer; and
removing the structured interlayer so that those regions of the structured glass layer that are located on the structured interlayer are lifted with it.

2. The process as claimed in claim 1, further comprising applying at least one passive electrical component to the structured glass layer so that the at least one passive electrical component is in contact with the at least one conductor structure.

3. The process as claimed in claim 2, wherein the at least one passive electrical component is selected from the group consisting of a capacitor, a resistor, a coil, a varistor, a Positive Temperature Coefficient (PTC) thermistor, a Negative Temperature Coefficient (NTC) thermistor, and a filter element.

4. The process as claimed in claim 1, further comprising repeating the steps of depositing a structured glass layer and of applying at least one conductor structure a number of times.

5. The process as claimed in claim 1, wherein prior to the application of the structured glass layer by evaporation coating, the process further comprises applying a conductive material to the contact-connection region so that the conductive material projects with respect to regions adjacent to the contact-connection regions and is covered by the structured interlayer.

6. The process as claimed in claim 1, wherein the step of applying the structured interlayer comprises printing or photolithographic structuring.

7. The process as claimed in claim 1, wherein the step of applying at least one conductor structure comprises the step of applying electrically conductive material by electroplating, sputtering or evaporation coating.

8. The process as claimed in claim 1, further comprising applying an interconnect to the substrate prior to the step of depositing the structured glass layer.

9. The process as claimed in claim 1, wherein the step of applying the at least one conductor structure comprises applying a plurality of structures each having different conductive materials.

10. The process as claimed in claim 1, further comprising the steps of depositing a final glass layer and producing at least one via in the final glass layer.

11. The process as claimed in claim 10, further comprising applying a soldering bead to the at least one via.

12. The process as claimed in claim 1, wherein the substrate comprises a semiconductor substrate with active semiconductor regions, and wherein the step of applying the at least one conductor structure comprises connecting the at least one conductor structure to a connection location of the active semiconductor regions.

13. The process as claimed in claim 12, wherein each active semiconductor region is arranged on a first side of the substrate, and wherein the structured glass layer is deposited on the first side and the at least one conductor structure is applied to the structured glass layer.

14. The process as claimed in claim 12, wherein each active semiconductor region is arranged on a first side of the substrate, the first side the opposite side from a second side, and wherein the structured glass layer is deposited on the second side and the at least one conductor structure is applied to the structured glass layer, the process further comprising the step of introducing at least one via through the substrate so that the at least one via is connected to a connection location on the first side.

15. The process as claimed in claim 1, wherein the step of applying the at least one conductor structure comprises connecting the at least one conductor structure to a via through the substrate.

16. The process as claimed in claim 1, further comprising holding the substrate at a temperature of between 50° C. and 200° C. during the step of depositing the structured glass layer.

17. The process as claimed in claim 1, further comprising keeping a pressure at most in the range of $10^{-4}$ mbar during the step of depositing the structured glass layer.

18. The process as claimed in claim 1, wherein the structured glass layer is applied with a deposition rate of at least 0.1 μm of layer thickness per minute.

19. The process as claimed in claim 1, further comprising filling the at least one opening with conductive material.

20. The process as claimed in claim 1, wherein the structured glass layer is deposited on the substrate while the substrate is still joined to a wafer.

21. The process as claimed in claim 1, wherein the step of depositing the structured glass layer comprises plasma ion assisted deposition (PIAD).

* * * * *